United States Patent [19]

Zejda

[11] Patent Number: 5,112,467
[45] Date of Patent: May 12, 1992

[54] CATHODE SPUTTERING APPARATUS

[75] Inventor: Jaroslav Zejda, Rodenbach, Fed. Rep. of Germany

[73] Assignee: Leybold Aktiengesellschaft, Fed. Rep. of Germany

[21] Appl. No.: 656,235

[22] Filed: Feb. 15, 1991

[30] Foreign Application Priority Data

Jun. 29, 1990 [DE] Fed. Rep. of Germany ....... 4020659

[51] Int. Cl.⁵ .............................................. C23C 14/34
[52] U.S. Cl. ............................ 204/298.12; 204/298.11
[58] Field of Search ....................... 204/298.11, 298.12

[56] References Cited

U.S. PATENT DOCUMENTS

| 4,169,031 | 9/1979 | Brors | 204/192.12 |
| 4,515,675 | 5/1985 | Kieser et al. | 204/298.12 |
| 4,564,435 | 1/1986 | Wickersham | 204/298.12 |
| 4,668,373 | 5/1987 | Rille et al. | 204/298.12 |
| 4,820,106 | 4/1989 | Walde et al. | 414/217 |
| 4,820,397 | 4/1989 | Fielder et al. | 204/298.12 |

FOREIGN PATENT DOCUMENTS 0291690  4/1988  European Pat. Off. ....... 204/298.25

Primary Examiner—Aaron Weisstuch
Attorney, Agent, or Firm—Hill, Van Santen, Steadman & Simpson

[57] ABSTRACT

A cathode sputtering apparatus provided with a quick disconnect mechanism for rapid replacement of a target. The quick disconnect mechanism preferably includes a rotatable sleeve that upon appropriate rotation exerts a clamping force on the target. The clamping force preferably is created by balls caused to cam radially outward from a central axis.

20 Claims, 4 Drawing Sheets 5,112,467

CATHODE SPUTTERING APPARATUS

BACKGROUND OF THE INVENTION

The present invention generally relates to cathode sputtering apparatus. More specifically, the invention relates to cathode sputtering apparatus with a target as is utilized in vacuum coating technology, for example, the cathode sputtering apparatus discussed in the Leybold AG brochure 12-710.01 entitled "Compact Disks Vakuum-Beschichtungstechnik". The invention, however, is not limited to the instances discussed in the brochure.

An apparatus for inward and outward transfer of an essentially flat workpiece into and out from a vacuum coating chamber is disclosed in European patent application 0291690, having corresponding U.S. Pat. No. 4,820,106, the teachings of which are fully incorporated herein by reference. The disclosed apparatus is also used for delivering the workpiece into and returning the workpiece out of the region of a coating source so that the workpiece can be coated, ie., have a surface treated.

The disclosed apparatus is characterized by the inclusion of a coating apparatus disposed in a coating chamber and having one or more cover-shaped or cap-like workpiece carriers with the assistance of which workpieces can be brought into a position neighboring an opening in a cover of the coating chamber.

The opening can be closed on one side by the workpiece carrier and on another side by an elevating plate that is held and guided by a turntable rotatably mounted within the coating chamber. The workpiece carrier can be pressed against the opening in the cover of the coating chamber by a lifting cylinder or pack that is supported on the loading device, another elevating plate can be pressed against the opening by a lifting device fastened to a bottom plate.

In coating apparatus of this type as well as in cathode sputtering devices generally, it is necessary to replace the targets therein. To date, the targets have been secured to cathode chamber parts by means of screws or clamp members. As a result, target replacement is complicated, time consuming, and expensive. Further, manufacturing processes, ie., the coating of substrates, must be interrupted for relatively long periods of time during target replacement.

SUMMARY OF THE INVENTION

The present invention provides for relatively simple and less time consuming target replacement in a coating device. More specifically, the invention provides a quick disconnect coupling for securing targets to enable simple and fast mounting/dismounting of targets To these ends, in one embodiment, the invention provides a target unit comprising a target and a target holder or base, and a clamping mechanism secured to a cathode sputtering apparatus, the clamping mechanism releasably securing the target holder to the cathode sputtering apparatus.

In a preferred embodiment of the invention, the clamp mechanism comprises of at least one (but preferably three or more) roller member (viz. camming member) and ramp mechanism (viz. camming surface) pair, that, given related motion of the ramp mechanism vis-a-vis its roller member, a clamping pressure is exerted onto the target units. The roller member preferably comprises a ball. It can thereby be provided that the clamping pressure is applied radially against the target unit.

In one embodiment of the invention, the clamp mechanism preferably is disposed internally of an annular target unit and the pressing power of the clamp mechanism acts on the target unit in a radially outward direction.

In another embodiment of the invention, the clamp mechanism can comprise a rotatable clamping sleeve that preferably is provided with a plurality of ramps upon which are engaged roller members, the clamping sleeve upon rotation pressing the roller members indirectly or directly against the target unit.

In another embodiment of the invention, the clamping sleeve is fashioned as a safety bolt that can be turned a defined amount around the axis of the target unit to thereby lock the target unit in its working or operating position A cost-beneficial structure can be provided wherein the ramps are constructed as eccentric milled-out portions on the generated surface of such a clamping sleeve.

In a preferred embodiment of the invention, to each ramp surface is allocated a pair of ball members separated by a spacer, the ball members and spacer being disposed between the ramp surface and the target unit.

Preferably, the clamp mechanism is disposed in an upper removable part of the cathode chamber, such as a cover, preferably a pivotable cover, so that the target unit can be accessed and released when the removable part is in its removed or pivoted position.

In a preferred embodiment, the cathode station is provided with a two-part mask, a central part of which is secured to the removeable part of the cathode chamber so that the central part of the mask is also removable. The other part of the mask preferably remains in its operating or working position.

The rolling members preferred comprise an insulating material. A material such as $Al_2O_3$ is preferred.

These and other features and aspects of the invention as well as the advantages thereof will become apparent with reference to the following detailed description of the presently preferred embodiments and accompanying drawings.

DETAILED DESCRIPTION OF THE PRESENTLY PREFERRED EMBODIMENTS

Figure 1:
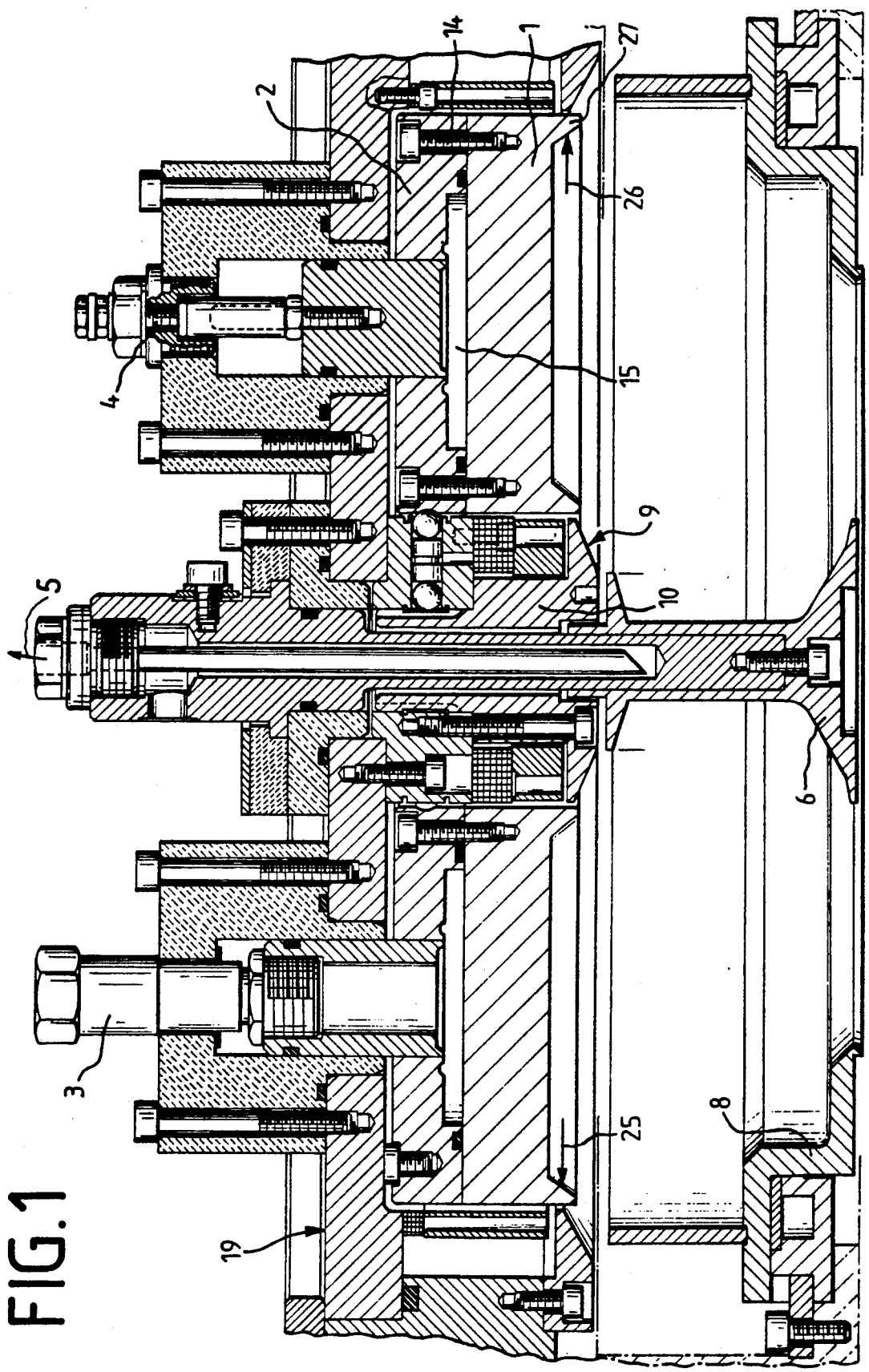
FIG. 1 is a cross sectional view of an upper pivotable portion of a cathode sputtering station.

In FIG. 1 there is illustrated an upper portion 19 of a cathode chamber on which is received an annular target unit. As illustrated, the target unit comprises a target 1 and a target base plate 2, the base plate 2 serving as a target holder. In the attached claims, the term target unit refers generically either to the target, the target base plate/holder, or both.

The target 1 and base plate 2 are secured together by means of screw bolts 14. The upper portion 19 essentially comprises the cover of the cathode chamber.

A water cooling space 15 is formed and provided between the target 1 and the target base plate 2. In operation, cooling water supplied to the water cooling space 15 serves to cool the target unit.

Cooling water is supplied to the water cooling space 15 via a quick disconnect 3. Electrical power is supplied to the cathode sputtering apparatus via another quick disconnect 4. The quick disconnects 3 and 4 are disposed on the upper portion 19 so as to be offset by 180° relative to each other, ie., on opposite ends of an imaginary diameter.

Together with the upper portion 19 of the cathode chamber, the target unit can be pivoted away from other parts of the cathode chamber in the direction indicated by the arrow 5.

Figure 5:
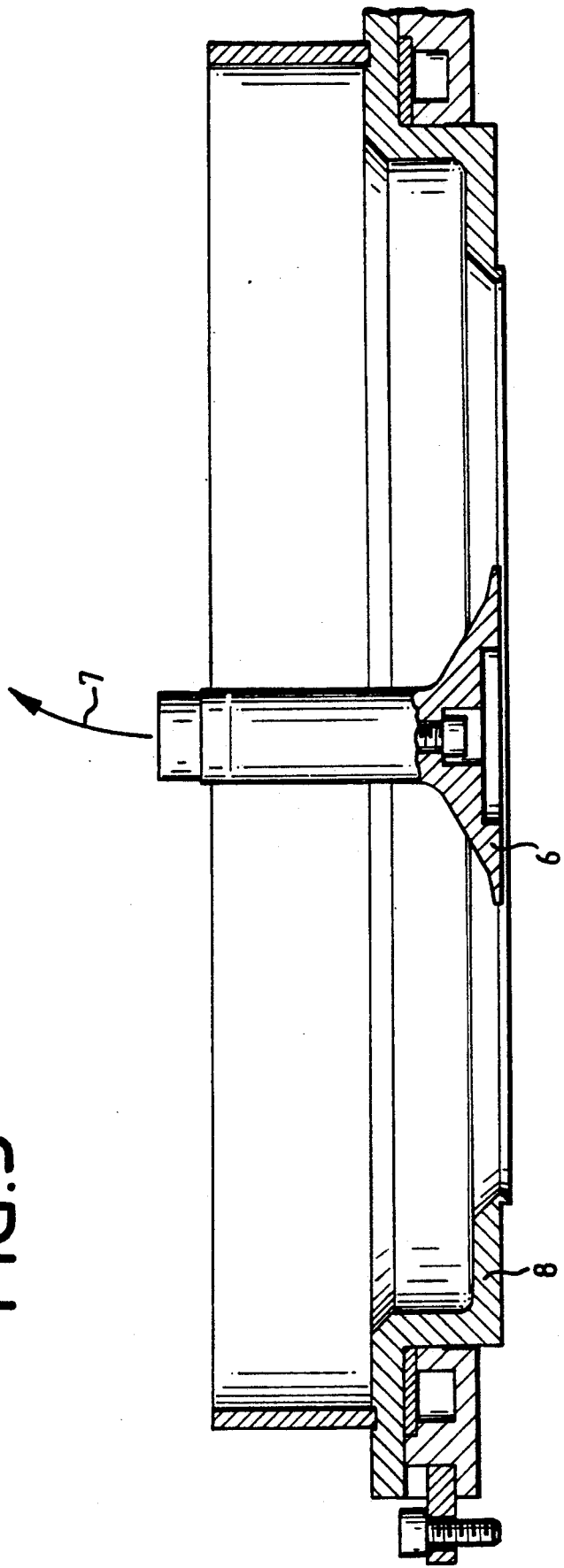
FIG. 5 is a section view of a mask used in the cathode sputtering station of FIG. 1.

A central mask part 6 of a two part mask of the cathode chamber is secured to an underside of the upper portion 19. This is also illustrated in FIG. 5. The other part of the mask is a stationary mask 8 which remains fixed to the other portion of the cathode chamber. When the upper portion 19 is pivoted, the central mask part 6 also pivots in the direction of arrow 7 in FIG. 5. As illustrated, the central mask part 6 pivots away from the stationary mask part 8.

In FIGS. 1 and 5, the mask parts 6 and 8 are illustrated in their operating positions, ie., when the cathode chamber is in use. The mask serves to concentrate plasma on a substrate or workpiece (not illustrated) during the sputtering process. This is adequately discussed in U.S. Pat. No. 4,820,106, the teachings of which are fully incorporated herein, and the other prior art.

Figure 2:
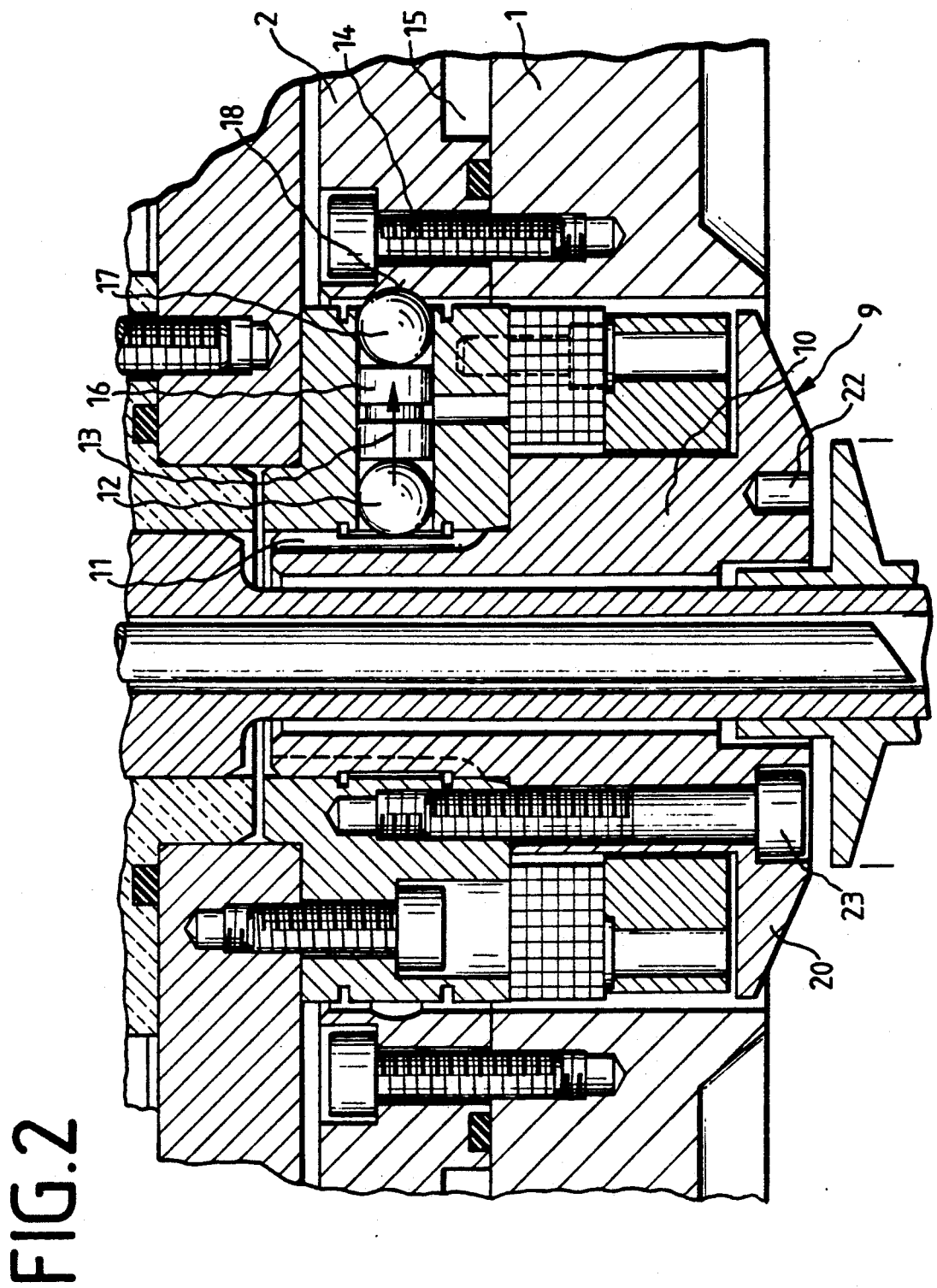
FIG. 2 is an enlarged detail of the upper pivotable portion of FIG. 1.
Figure 3:
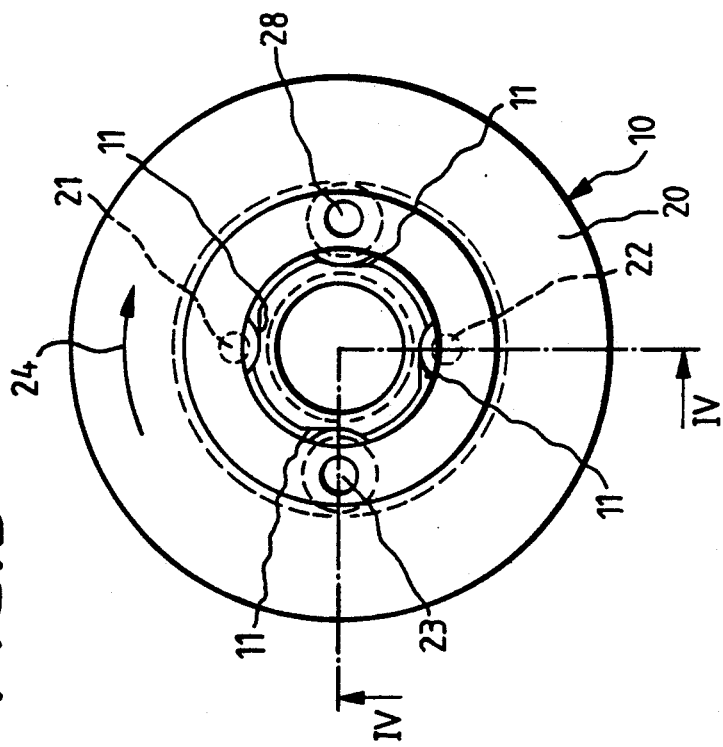
FIG. 3 is a clamping sleeve used in the cathode sputtering station of FIGS. 1 and 2.

Included in the illustrated upper portion 19 of the cathode chamber is a clamp mechanism 9 comprising a clamping sleeve 10 with milled-out portions 11 about its outer generated surface. The clamping mechanism is illustrated in greater detail in FIGS. 2—4. With reference to FIG. 3, it can be seen that a total of four milled-out portions 11 preferably are provided.

The milled-out portions 11 of the clamping sleeve 10 preferably are formed so as to have ramped surfaces. As illustrated in FIG. 2, each milled-out portion 11 includes a ball 12 engaged therein. When the clamping sleeve 10 is rotated by about 45° relative to the remainder of the upper portion 19, the four balls 12 engaged within the milled-out portions 11 are cammed or pressed radially outward in the direction of the arrow 13 by the ramped surfaces.

As illustrated, adjacent each ball is a second ball 17 with a spacer 16 disposed therebetween. Each set of balls 12 and 17 and spacer 16 are operatively disposed between the clamping sleeve 10 and the target unit. Cooperating milled out portions 18 in the outer generated surface of the target unit base plate 2 are provided within which the balls 17 can be engaged.

It can be appreciated that as the balls 12 are cammed radially outward, the balls 17 are pressed, in turn, into engagement in their cooperating milled out portions 18 in the outer generated surface of the base plate 2. In this manner, the clamping sleeve 10 and the associated milled out portions 1 and 18, as well as the balls 12 and 17 act as a safety bolt that locks the target unit in its working position.

It can also be appreciated that in certain constructions, a spacer such as the spacer 16 need not be provided. In such a case, the balls, such as the balls 12 and 17, engage against each other.

The preferred manner in which a target unit is replaced is now discussed.

It should be recalled that the cathode chamber portion illustrated in FIGS. 1 and 2 can be pivoted 180° along the direction indicated by the arrow 5 from a first working or sputtering position to a second maintenance position. In the second position, the target 1 and a mushroom shaped or button-shaped end 20 of the clamping sleeve, as well as all parts connected to the underside of the pivotable portion of the cathode station, are easily accessible.

To remove a target unit, a safety screw 23 is loosened. Then, a special tool in the form of a pin wrench is engaged in blind holes 21 and 22. The clamping sleeve 10 is rotated about 45° with the tool along the direction indicated by arrow 24 in FIG. 3. As a result, the balls 12 and 17 and space 16 are released, thereby releasing the target unit.

The target unit preferably is seized by a pull-off mechanism whose pointed grasping members are first radially pressed against the edge of the unit base plate 2 in the direction indicated by arrows 25 and 26 (see FIG. 1). The target unit is then removed by moving same in an axial direction away from the cathode station upper portion 19.

The cooling water and electricity are also disconnected by appropriate disconnection of quick disconnects 3 and 4, respectively.

Introduction of a target unit into the pivotable portion of the cathode sputtering station is a reverse process. First, the target unit is axially inserted onto the upper portion 19. Then, the cooling water and electricity quick disconnects 3 and 4 are reconnected.

Subsequently, the sleeve 10 is rotated approximately 45° in a direction opposite that indicated by the arrow 24. As a result, the four balls 12 are again pressed or cammed radially outward to in turn force the balls 17 into the milled out portion 18 of the target unit base plate 2, thereby securing the target in place.

Figure 4:
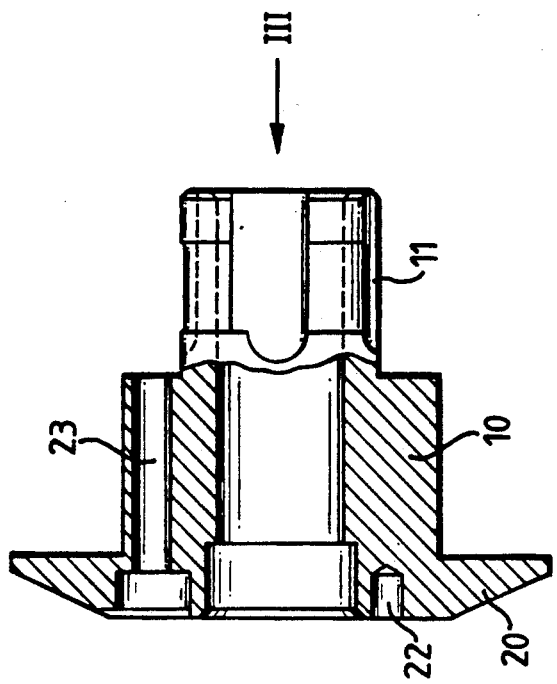
FIG. 4 is a section view taken along the line IV—IV of FIG. 3.

Thereafter, the safety screws 23 and 28 are appropriately screwed in. In FIGS. 3 and 4, the bores in which the screws 23 and 28 are received are indicated as 23 and 28 as well.

Preferably, the balls 12 and 17 are constructed of a hard insulating material. $Al_2O_3$ is a suitable material for this purpose. The insulating property is needed because there is a voltage difference that arises between the target unit and the cover 19 of the cathode sputtering station.

As mentioned above, for small cathodes, the spacers 16 can be omitted and then only one or two balls are clamped between the clamping sleeve 10 and the target unit base plate 2.

While a preferred embodiment has been shown, modifications and changes may become apparent to those skilled in the art which shall fall within the spirit and scope of the invention. It is intended that such modifications and changes be covered by the attached claims.

For example, the clamping mechanism described above could be configured so that the clamping forces are exerted inwardly. In such a construction, an annular clamping sleeve with internal camming surfaces would surround the target unit. Another member or members containing the clamping balls would be disposed between the clamping sleeve and the target unit. Rotation of the sleeve would serve to engage the balls against or release the balls from engaging against the target unit.

Therefore, the target unit would be clamped about an outer periphery thereof.

I claim:

1. A cathode sputtering apparatus comprising a target unit and a quick disconnect clamp mechanism securing said target unit within said cathode sputtering apparatus, wherein said quick disconnect clamp mechanism comprises a rotatable sleeve member provided with at least one camming surface and a camming member engageable with said camming surface so that upon rotation of said sleeve member said camming member operatively is wedged between said camming surface and another surface to secure said target unit within said cathode sputtering apparatus.

2. The cathode sputtering apparatus of claim 1, wherein said target unit comprises a target secured to a target base plate and said base plate is secured by said quick disconnect clamp mechanism.

3. The cathode sputtering apparatus of claim 2, wherein said target unit is annular in shape.

4. The cathode sputtering apparatus of claim 1, wherein said camming surface comprises a milled out ramp portion disposed about an outer periphery of said sleeve member.

5. The cathode sputtering apparatus of claim 1, wherein said camming member comprises at least one ball.

6. The cathode sputtering apparatus of claim 5, wherein said camming member comprises at least two balls.

7. The cathode sputtering apparatus of claim 6, wherein said two balls are separated by a spacer member.

8. The cathode sputtering apparatus of claim 1, wherein said target unit is annular in shape and said quick disconnect clamping mechanism exerts a radial force about an inner periphery of said target unit.

9. The cathode sputtering apparatus of claim 1, wherein said camming surface is provided with a groove for each camming member and each camming member engages its respective groove when cammed to secure said target unit within said cathode sputtering apparatus.

10. The cathode sputtering apparatus of claim 1, wherein clamp mechanism comprises a rotatable annular ring disposed about a circumference of said target unit, said ring including at least one camming surface.

11. The cathode sputtering apparatus of claim 1, wherein said target unit is annular in shape.

12. The cathode sputtering apparatus of claim 1, wherein said apparatus comprises an upper portion and a lower portion, said upper portion being pivotally connected to said lower portion, said target unit being secured within said upper portion, said target unit being removable when said upper portion is pivoted away from said lower portion.

13. The cathode sputtering apparatus of claim 12, further comprising a two-part mask having a central portion thereof secured to the upper portion and an annular portion secured to the lower portion such that said central portion is pivoted away from said annular portion when said upper portion is pivoted away from said lower portion.

14. The cathode sputtering apparatus of claim 1, further comprising a coupling mechanism for a water supply that is operative to shut down said water supply when said target unit is removed.

15. The cathode sputtering apparatus of claim 1, further comprising a coupling mechanism for coupling power to the target unit and that is operative to terminate supply of power to said target unit when said target is removed.

16. A cathode sputtering apparatus comprising:
a target unit and a quick disconnect clamp mechanism operatively disposed to releasably secure said target unit to said cathode sputtering apparatus, said target unit being annular in shape and said clamp mechanism comprising a rotatable sleeve member disposed within an inner periphery of said target unit, wherein said clamp mechanism further comprises operatively formed, milled out portions with ramped surfaces on an outer periphery of said sleeve member and rolling members engaged in said milled out portions so that rotation of said sleeve causes said rolling members to cam radially away from said sleeve member.

17. The cathode sputtering apparatus of claim 16, wherein said target unit includes milled out portions, wherein said rolling members are engaged upon rotation of said sleeve member.

18. The cathode sputtering apparatus of claim 17, wherein each rolling member comprises a pair of adjacent ball members and a spacer disposed therebetween.

19. The cathode sputtering apparatus of claim 16, wherein said rolling members are made of an insulating material.

20. The cathode sputtering apparatus of claim 19, wherein said insulating material comprises $Al_2O_3$.

* * * * *